(12) United States Patent
Berkhout

(10) Patent No.: US 6,414,544 B2
(45) Date of Patent: Jul. 2, 2002

(54) DEMODULATION FILTER

(75) Inventor: Marco Berkhout, Nijmegen (NL)

(73) Assignee: Koninklijke Philips Electronics N.V., New York, NY (US)

(*) Notice: Subject to any disclaimer, the term of this patent is extended or adjusted under 35 U.S.C. 154(b) by 0 days.

(21) Appl. No.: 09/864,145

(22) Filed: May 24, 2001

(30) Foreign Application Priority Data

May 25, 2000 (EP) .............................................. 00201829

(51) Int. Cl.[7] ................................................ H03F 3/38
(52) U.S. Cl. ...................................... 330/10; 330/207 A
(58) Field of Search ............................. 330/10, 207 A, 330/251

(56) References Cited

U.S. PATENT DOCUMENTS 4,724,396 A * 2/1988 Taylor, Jr. et al. ............ 330/10
6,016,075 A * 1/2000 Hamo .......................... 330/10
6,300,825 B1 * 10/2001 Dijkmans et al. ............. 330/10

FOREIGN PATENT DOCUMENTS

EP    0776088 A2    5/1997

* cited by examiner

Primary Examiner—Robert Pascal
Assistant Examiner—Henry Choe
(74) Attorney, Agent, or Firm—Steven R. Biren

(57) ABSTRACT

The invention describes an improvement of a demodulation filter for use in a push-pull amplifier.

Known demodulation filters have the disadvantage that in the common mode they have a peaking and oscillating loop introducing great distortions.

The demodulation filter according to the invention overcomes these disadvantages by introducing a common mode damping without influencing the differential mode.

3 Claims, 3 Drawing Sheets

DEMODULATION FILTER

FIELD OF THE INVENTION

The invention relates to a push-pull amplifier as described in the pre-amble of claim 1. The invention further relates to a demodulation filter for use in a push-pull amplifier.

From European Patent application EP-A-0776088 an amplifier output stage is known having a demodulation filter. Herein a demodulation filter comprises inductances and capacitances to demodulate the signal before supplying to a load, for example a loudspeaker.

Further from a publication "A review and Comparison of Pulse Width Modulation (PWM) Methods For Analog and Digital Switching Power Amplifiers" of K. Nielsen 102 AES Convention, Munich March 1997, Preprint 4446 also a demodulation filter is known.

A disadvantage of such an amplifier and demodulation filter is that the described demodulation filter operates for common mode signals as an oscillating loop, and has a peaking in the common mode operation.

SUMMARY OF THE INVENTION

It is an object of the invention to provide a push-pull amplifier not having these disadvantages. To this end a push-pull amplifier according to the invention comprises the features of claim 1.

The demodulation filter according to the invention overcomes these disadvantages by introducing a common mode damping without influencing the differential mode.

The invention further relates to a demodulation filter for use in such a push-pull amplifier.

Further embodiments of the invention are described in the dependent claims.

Herewith a cross-reference is made to the following co-pending applications of the same applicant and of the same date:

"Carrousel handshake" applicant's ref. Nr. ID603908, Application No. 0 201 818.2

"Level shifter" applicant's ref. Nr. ID604680, Application No. 0 201 826.5

"Silent start" applicant's ref. Nr. ID604681, Application No. 0 201 827.3

"PWM limiter" applicant's ref. Nr. ID604682, Application No. 0 201 828.1.

BRIEF DESCRIPTION OF THE DRAWINGS

These and other aspects of the invention will be apparent from and elucidated with reference to the example of described hereinafter, herein shows FIG. 1 schematically an example of a push-pull amplifier, FIG. 2 an example of a demodulation filter for use in a push-pull amplifier according to the invention, FIG. 3 a common mode equivalent circuit of the example of FIG. 2, and FIG. 4 the common mode transfer characteristics of the common mode equivalent circuit.

DETAILED DESCRIPTION OF THE PREFERRED EMBODIMENT

Figure 1:
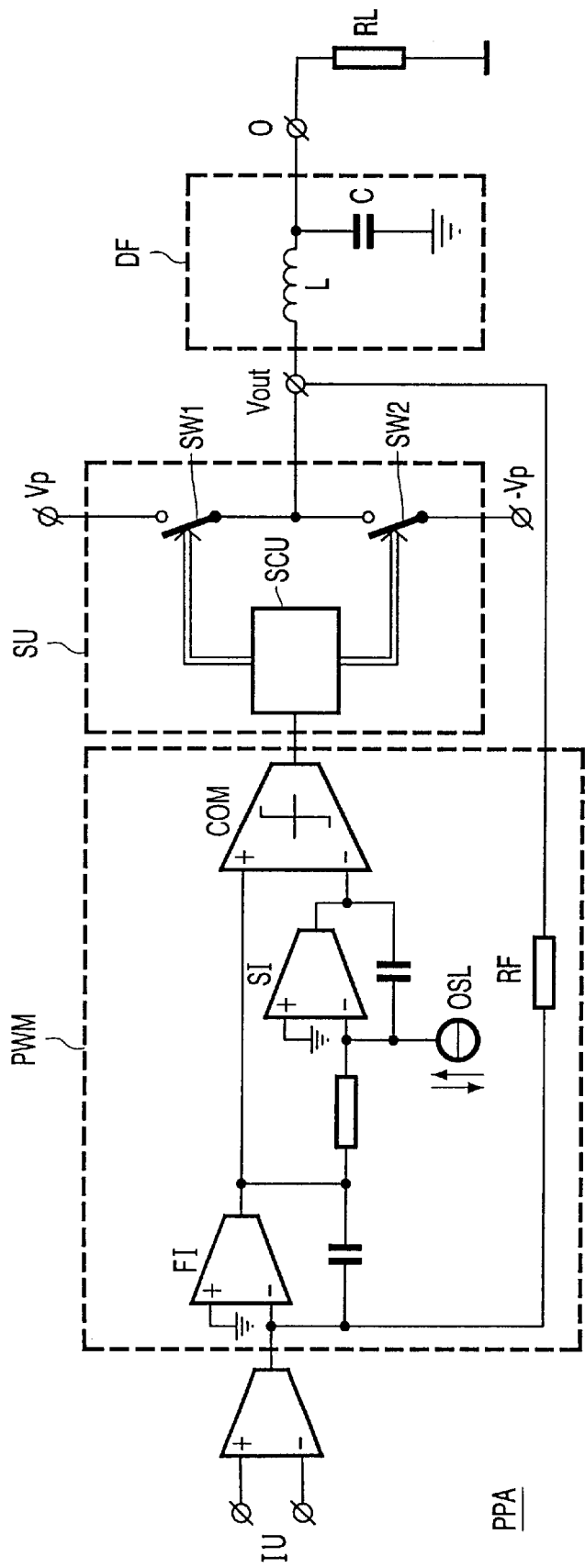

FIG. 1 shows block-schematic an example of a push-pull amplifier. Via an input unit IU the amplifier receives the input signal. The input unit is coupled to a pulse-width modulator PWM, which is coupled with an output to a switching unit SU. The switching unit supplies an output signal via a demodulation filter DF to the output O of the amplifier.

The pulse-width modulator is coupled in a feedback loop with a feedback element RF that is coupled with one side to the output of the switching unit SU and with the other side to the input of the pulse-width modulator.

The pulse-width modulator further comprises a first integrator FI and a second integrator SI and a comparator COM, the input of the first integrator is coupled to the output of the input unit IU and the input of the second integrator is coupled to an output of the first integrator FI and also coupled to an oscillator OSC.

The switching unit SU comprises a switch control unit SCU and a first and second switch SW1, SW2, respectively. The demodulation filter is in this example shown as an inductance L and a capacitance C can be a second order low-pass demodulation filter or higher order demodulation filter.

Figure 2:
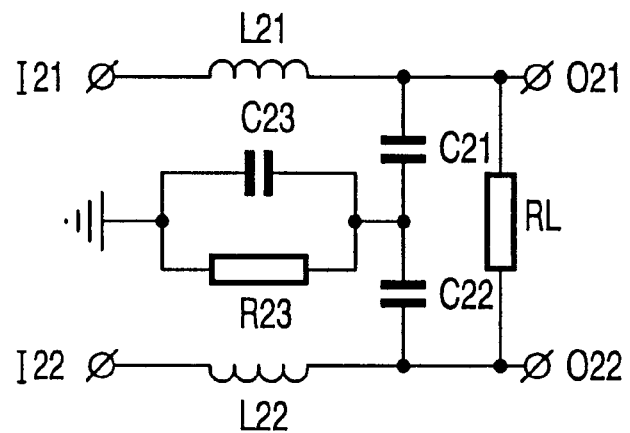

FIG. 2 describes an example of a demodulation filter DF2 for use in a push-pull amplifier according to the invention. The demodulation filter is coupled to a load $R_L$. This example of a demodulation filter comprises a first and second input I21, I22 respectively, and a first and second output O21, O22 respectively.

Between the first input and the first output a first inductance L21 is coupled, and between the second input and the second output a second inductance is coupled. Between the first output and the second output a series arrangement of a first capacitance C21 and a second capacitance C22 is coupled.

At the connection point of the first and the second capacitance a parallel arrangement of a third capacitance C23 and a resistance R23 is coupled, which parallel arrangement is coupled with the other side to a predetermined voltage for example zero.

The operation of this demodulation filter is improved in relation to the prior art demodulation filters due to the adding of the resistor R23 and the capacitance C23 to provide common mode damping.

However, these components do not influence the differential mode transfer. Further, there is no quiescent dissipation in the resistor R23. If this demodulation filter DF2 is dimensioned for the same common mode attenuation and differential mode cut-off frequency as the prior art demodulation filter the peaking is reduced to 2.9 dB while the high frequency differential attenuation is improved 16 dB.

Dimensioning of the demodulation filter can be done as follows. The values of the differential mode components $L_D$ and $C_D$ can be calculated from the values $L_{SE}$ and $C_{SE}$ for a single ended filter with the same load as:

LD=LSE/2

CD=2.$C_{SE}$

The differential mode frequency transfer is given by:

$$H_D(s) = \frac{1}{s^2 L_D C_D + s\frac{2L_D}{R_L} + 1}$$

The component $L_D$ is in this example equal to L21 and to L22, and the component $C_D$ equal to C21 and to C22.

Figure 3:
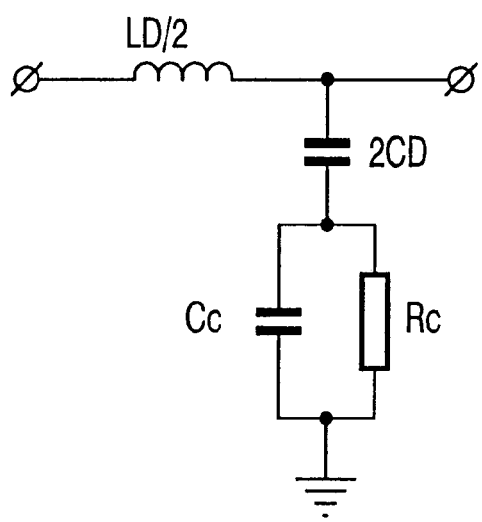
Figure 4:
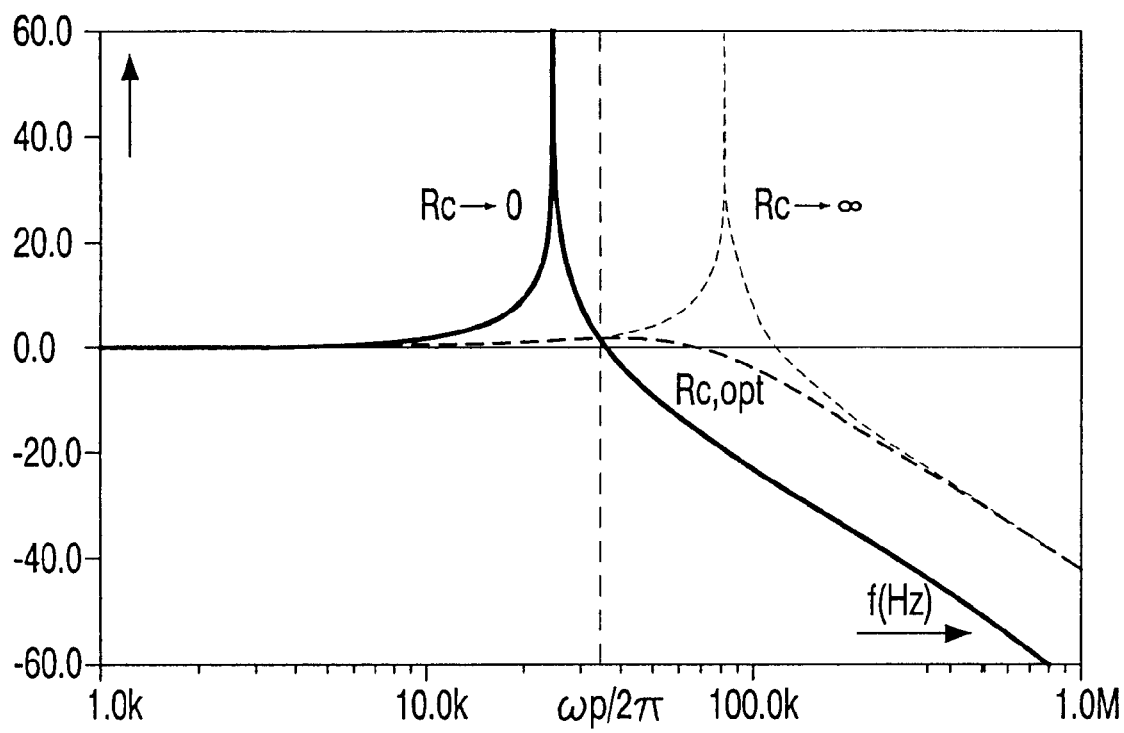

For the dimensioning of the common mode components a common mode equivalent circuit is used as shown in FIG. 3, and the common mode characteristics are shown in FIG.

4. Also herein the value of $L_D$ is equal to L21 and to L22, and the value of $C_D$ is equal to C21 and to C22. Further the value of $C_C$ is equal to C23 and the value of $R_C$ is equal to R23.

The common mode transfer is given by:

$$H_C(s) = \frac{sR_C(C_C + 2C_D) + 1}{s^3 L_D C_D C_C R_C + s^2 L_D C_D + sR_C(C_C + 2C_D) + 1}$$

For very small values of $R_C$ the transfer converges to:

$$H_C(s)\big|_{R_c \to 0} = \frac{1}{s^2 L_D C_D + 1}$$

which peaks at the cut-off frequency of the differential mode transfer. For very high values of RC the transfer converges to:

$$H_C(s)\big|_{R_c \to \infty} = \frac{1}{s^2 L_D \frac{C_D C_D}{2C_D + C_C} + 1}$$

which peaks at a higher frequency. The peaking can be damped to a minimal value.

It is to be noticed here that the above-mentioned example of the demodulation filter can be amended without departing from the invention.

A demodulation filter according to the invention can be used with all kind of push-pull amplifiers (for example Class D-amplifiers). Instead of the push-pull amplifier as described in relation to FIG. 1.

What is claimed is:

1. Push-pull amplifier having an input for receiving an input signal and output for supplying an output signal, whereby the push-pull amplifier comprises a modulator, a comparator and a feedback element, a switching-unit having a at least two switches coupled to the output of the modulator and a demodulator filter coupled to the output of the switching-unit, characterized in that the demodulator filter comprises a first input coupled via a first inductance to a first output, a second input coupled via second inductance to a second output, a series arrangement of a first and a second capacitance and a parallel arrangement of third capacitance and a resistance coupled with a first side to the connection point of the first and second capacitance.

2. Push-pull amplifier as claimed in claim 1, characterized in that the push-pull is a Class D amplifier.

3. Demodulation filter for use in a push-pull amplifier as claimed in claim 1.

* * * * *